United States Patent
Kim et al.

(10) Patent No.: US 8,293,656 B2
(45) Date of Patent: Oct. 23, 2012

(54) SELECTIVE SELF-ALIGNED DOUBLE PATTERNING OF REGIONS IN AN INTEGRATED CIRCUIT DEVICE

(75) Inventors: Hun Sang Kim, San Ramon, CA (US); Hyungje Woo, Cupertino, CA (US); Shinichi Koseki, Palo Alto, CA (US); Eda Tuncel, Menlo Park, CA (US); Chung Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 562 days.

(21) Appl. No.: 12/505,404

(22) Filed: Jul. 17, 2009

(65) Prior Publication Data
US 2010/0297850 A1   Nov. 25, 2010

Related U.S. Application Data

(60) Provisional application No. 61/180,680, filed on May 22, 2009.

(51) Int. Cl.
*H01L 21/302* (2006.01)
(52) U.S. Cl. ......... 438/736; 438/714; 438/725; 438/735
(58) Field of Classification Search .......... 438/275, 438/706, 710, 712, 714, 717, 725, 735, 736, 438/257, 639; 430/310, 312
See application file for complete search history.

(56) References Cited

U.S. PATENT DOCUMENTS

| | | | | |
|---|---|---|---|---|
| 7,910,443 B2 * | 3/2011 | Cho | ................ | 438/275 |
| 2005/0186746 A1 * | 8/2005 | Lee et al. | ........... | 438/300 |
| 2005/0266318 A1 | 12/2005 | Shirai et al. | | |
| 2006/0258162 A1 | 11/2006 | Abatchev et al. | | |
| 2007/0184664 A1 * | 8/2007 | Lee et al. | ........... | 438/706 |
| 2008/0220600 A1 | 9/2008 | Alapati et al. | | |
| 2009/0294874 A1 * | 12/2009 | Lee | ........... | 257/401 |

FOREIGN PATENT DOCUMENTS

KR   10-2005-0122737   12/2005

OTHER PUBLICATIONS

International Search Report and Written Opinion for Application No. PCT/US2010/034605 dated Dec. 23, 2010, 7 pages.
International Preliminary Report on Patentability for Application No. PCT/US2010/034605, dated Nov. 22, 2011, 5 pages.

* cited by examiner

*Primary Examiner* — Lan Vinh
(74) *Attorney, Agent, or Firm* — Blakely, Sokoloff, Taylor & Zafman

(57) ABSTRACT

A selective self-aligned dual patterning method. The method includes performing a single lithography operation to form a patterned mask having a narrow feature in a region of a substrate that is to a have pitch-reduced feature and a wide feature in a region of the substrate that is to have a non-pitch-reduced feature. Using the patterned mask, a template mask is formed with a first etch and the patterned mask is then removed from the narrow feature while being retained over the wide feature. The template mask is then thinned with a second etch to introduce a thickness delta in the template mask between the narrow and wide features. A spacer mask is then formed and the thinned narrow template mask is removed to leave a pitch double spacer mask while the thick wide template mask feature is retained to leave a non-pitch reduced mask.

19 Claims, 5 Drawing Sheets

SELECTIVE SELF-ALIGNED DOUBLE PATTERNING OF REGIONS IN AN INTEGRATED CIRCUIT DEVICE

This application claims the benefit of U.S. Provisional Application No. 61/180,680, filed May 22, 2009, entitled Selective Self-aligned Double Patterning of Regions in an Integrated Circuit Device, the entire contents of which are hereby incorporated by reference herein.

BACKGROUND

1) Field

Embodiments of the present invention pertain to the field of Integrated Circuit (IC) Device Processing and, in particular, to self-aligned double patterning (SADP) of an IC device.

2) Description of Related Art

In a conventional semiconductor lithographic process a mask or reticle is positioned above a photoresist layer during a lithographic process exposing the layer to radiation (hv) having a particular wavelength (λ). Each feature of patterned photoresist layer has a critical dimension (CD) and is adjacent to another patterned feature spaced apart by a distance. The feature CD added to the space between features is typically referred to as the pitch.

The resolution limit for a particular lithographic process may be characterized with features having a CD equal to the space between the features. For example, a conventional 193 nm lithography system may provide a minimum pitch of 130 nm and a 65 nm half pitch. To reduce the effective half pitch of patterns formed in a substrate, density-sensitive integrated circuit (IC) product lines, such as dynamic random access memory (DRAM), are pursuing double patterning (DP) to define a pattern in a substrate having a half pitch below that lithographically achievable with the particular lithography employed (e.g., "sub-minimum half-pitch"). One type of DP is known as self-aligned DP (SADP) where a sidewall spacer mask is fabricated having spacer lines formed adjacent to the sidewalls of a template mask. For every line of the template mask, two spacer mask lines are generated. As such, a spacer mask providing substantially the same critical dimension (or less) for each line, but having double the density of lines in a particular region, may be fabricated.

Because SADP methods are independent of the lithographic technology employed, they can be practiced with 193 nm lithography as well as high NA or EUV lithography to provide a sub-minimum half pitch. SADP methods however are potentially cost prohibitive, particularly as a result of production cycle time, which increases when a DP method employs many additional operations to pattern a particular layer. Furthermore, SADP methods pose a difficulty where pitch reduction is desired in only one portion of an IC, such as a memory cell area, while no reduction in pitch from a lithographically defined mask pattern is desired in another portion of the IC, such as a periphery area. SADP methods requiring a lithographic patterning of a cell area separate from a periphery area are disadvantageous in that a particular device layer would then require two separate masks and lithography operations (i.e., a first mask to pattern regions not employing SADP and a second mask to pattern regions with a SADP process).

SUMMARY

Embodiments of the present invention include methods of selective self-aligned dual patterning (SADP). In an embodiment, a single photolithography process (e.g., mask exposure operation) is utilized to pattern regions of a substrate with features having significantly larger CD than features in other regions of the substrate. For example, a memory circuit may have both a cell region with narrow features having a minimum CD and pitch and also a periphery region (outside of the cell region) with wide features having significantly larger CD and/or feature pitch. Embodiments of the selective SADP processes described herein utilize this difference in feature CD to selectively reduce the pitch and/or CD of the cell region to a sub-lithographic CD and/or feature pitch while the periphery region retains the essentially the feature CD and/or pitch as lithographically defined in the single photolithography process.

In one embodiment, a narrow feature and a wide feature is lithographically patterned in a photo resist layer disposed over a hard mask and a first etch of an underlying hard mask layer is performed to transfer both the narrow feature and the wide feature into the underlying hard mask layer. The photo resist layer is then removed from over the narrow feature to expose an additional portion of the underlying hard mask layer (where the narrow feature was formed), while substantially retaining photo resist over the wide feature. A second etch is performed to thin the exposed narrow feature relative to the wide feature masked by the photo resist layer. A sidewall spacer is formed adjacent to a first and second sidewall of the narrow feature and the thinned narrow feature is etched through while the thicker wide feature is retained. The spacers may then be used in the cell region as a CD and/or pitch-reduced mask for subsequent patterning of an underlying mask or device layer(s) while the retained film of the wide feature is used in the periphery region as a non-CD and/or pitch-reduced mask for subsequent pattering of the underlying mask or device layer(s).

BRIEF DESCRIPTION OF THE DRAWINGS

Embodiments of the present invention are illustrated by way of example, and not limitation, in the figures of the accompanying drawings in which.

DETAILED DESCRIPTION

Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. In the following description, numerous specific details are set forth, such as fabrication conditions and materials, to provide a thorough understanding of the present invention. However, particular embodiments may be practiced without one or more of these specific details, or in combination with other known methods, materials and apparatuses. Furthermore, the particular features, structures, materials, or characteristics described may be combined in any suitable manner in one or more embodiments. It should also be understood that specific embodiments may be combined where not mutually exclusive. The accompanying Figures are illustrative representations and not necessarily drawn to scale.

The terms "over," "under," "between," and "on" as used herein refer to a relative position of one member with respect to other members. As such, for example, one member disposed over or under another member may be directly in contact with the other member or may have one or more intervening members. Moreover, one member disposed between members may be directly in contact with the two members or may have one or more intervening members. In contrast, a first member "on" a second member is in contact with that second member. Additionally, the relative position of one member with respect to other members is provided assuming operations are performed relative to a substrate without consideration of the absolute orientation of the substrate.

Some portions of the detailed descriptions which follow are presented in terms of algorithms and symbolic representations of operations on data bits within a computer memory. Unless specifically stated otherwise, as apparent from the following discussion, it is appreciated that throughout the description, discussions utilizing terms such as "displaying", "receiving", "consolidating", "generating", "updating", or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
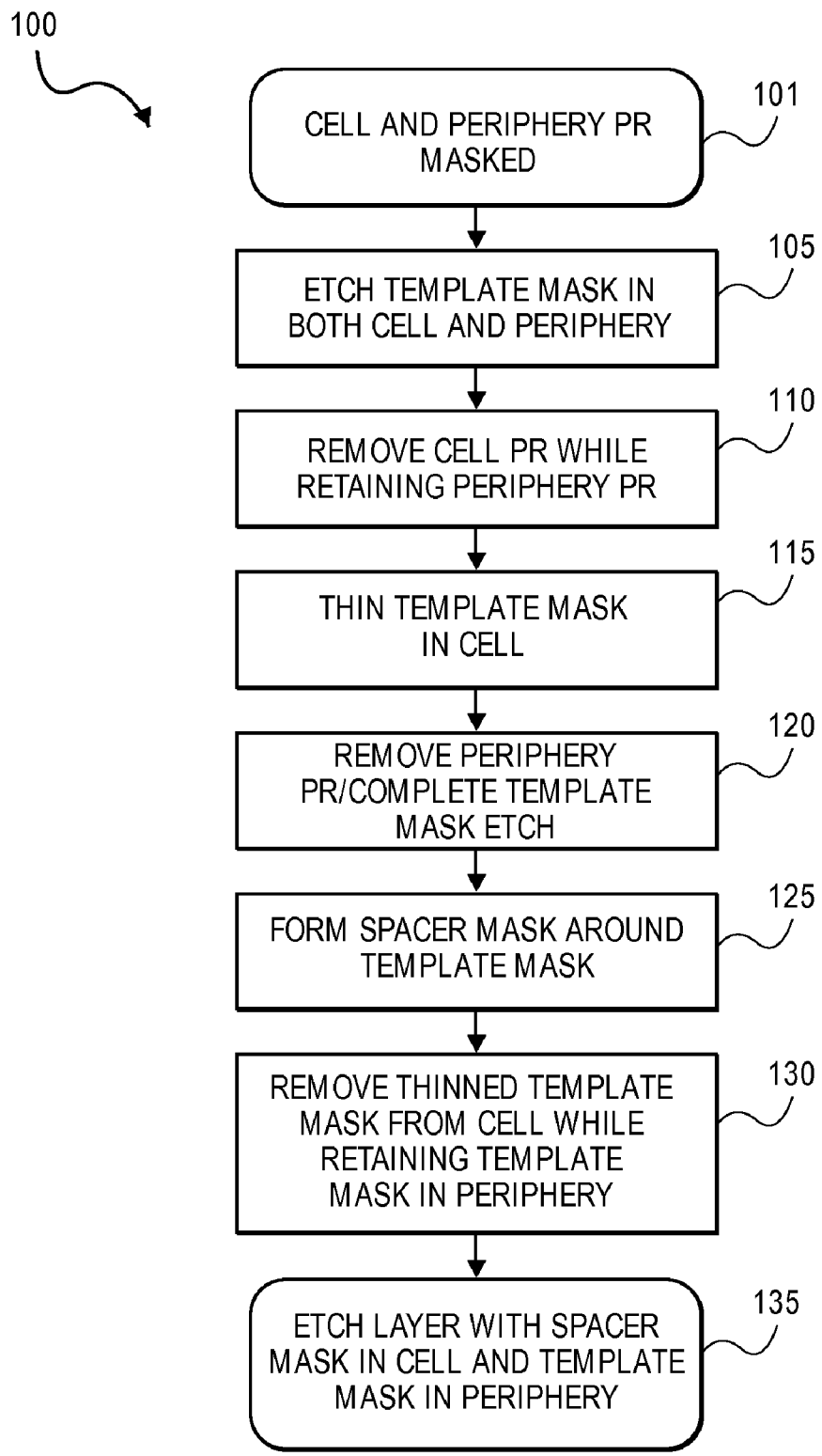
FIG. 1 illustrates a flow diagram of a selective SADP process, in accordance with an embodiment of the present invention.

FIG. 1 illustrates a flow diagram of a selective SADP process 100, in accordance with an embodiment of the present invention. The selective SADP process 100 begins at operation 101 with a multi-layered mask stack formed in both a first substrate region (e.g., "cell") which is to undergo a feature pitch and/or CD reduction and a second substrate region (e.g., "periphery") which is not to undergo a pitch and/or CD reduction. The multi-layered mask stack includes a patterned photosensitive mask (i.e., photo resist, "PR") disposed over an unpatterned hard mask. The hard mask may further comprise any number of thin film layers known in the art to be applicable to SADP.

Figure 2A:
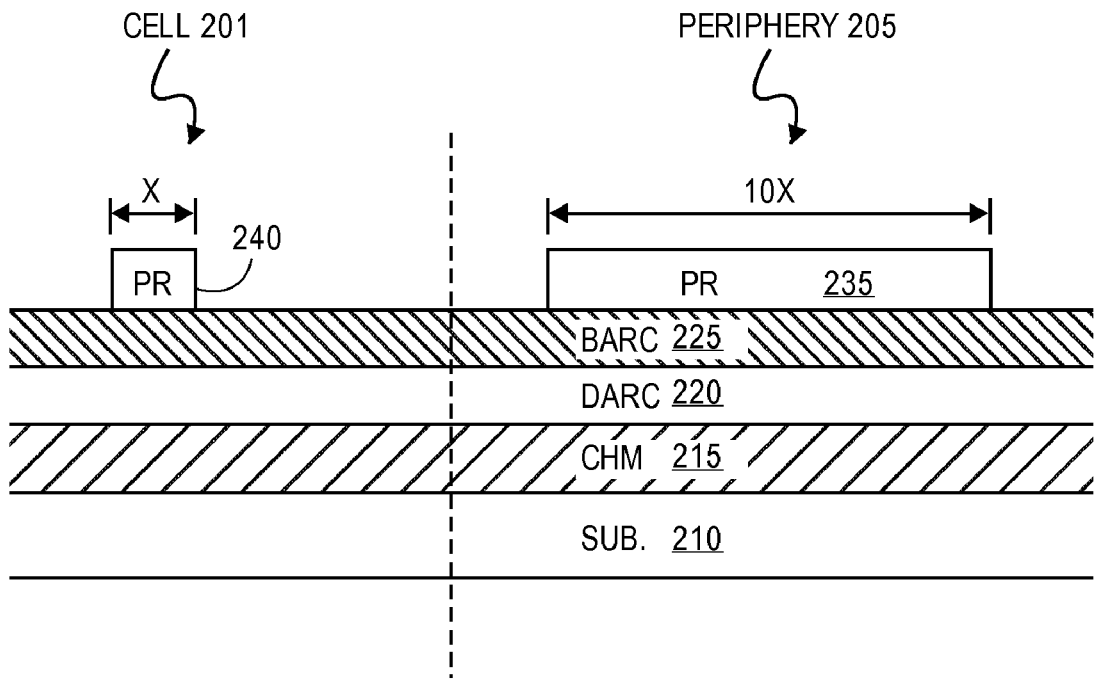
FIGS. 2A, 2B, 2C, 2D, 2E, 2F, and 2G illustrate cross-sectional views representing a series of operations in a selective SADP process, in accordance with an embodiment of the present invention.

FIG. 2A depicts an exemplary cross-sectional view of an integrated memory circuit device fabrication process at operation 101. As shown, a substrate 210 includes both a cell region 201 and a periphery region 205. An exemplary unpatterned hard mask includes a carbon-based mask (CHM) 215 disposed over the substrate 210, a dielectric anti-reflective coating (DARC) 220 disposed over the CHM 215 and a bottom anti-reflective coating (BARC) 225 disposed over the DARC 220. Over the unpatterned hard mask layers, a patterned photo resist layer forms a narrow resist feature 240 in the cell region 201, and a wide resist feature 235 in the periphery region 205. As such, a single photolithography operation is performed to simultaneously pattern both the cell region 201 and the periphery region 205. The photo resist layer may be composed of a material suitable for use in a lithographic process. In a specific embodiment, the photo resist is a positive photoresist material such as, but not limited to, a 248 nm resist, a 193 nm resist, a 157 nm resist, or an extreme ultra-violet (EUV) resist. In another embodiment, the photo resist is composed of a negative photo resist material.

As depicted, the CD of the narrow resist feature 240 is significantly smaller than that of the wide resist feature 235. Although FIG. 2A is not drawn to scale, generally, the narrow resist feature 240 should have a CD which is less than twice the thickness of the resist layer and preferably on the order of the thickness of the resist layer or less. In embodiment, the CD of wide resist feature 235 is between approximately 4 times the CD of the narrow resist feature 240 and many thousands of times larger than the CD of the narrow resist feature 240. In one exemplary embodiment, the wide resist feature 235 is on the order of 400 nm while the narrow mask feature 240 is on the order of 40 nm, for a 10× difference in the smallest feature dimension between the cell region 201 and the periphery region 205.

The exemplary multi-layered hard mask depicted in FIG. 2 further includes the BARC 225, which may be of any known composition in the art, such as one including polyamides or polysulfones and have less than 5 wt % carbon and may be of any thickness between approximately 100-500 angstroms. Disposed below the BARC 225 is a DARC 220 which may serve as a stop layer during an etch of the BARC 225 and may therefore be of any material which may withstand etching of the BARC 225, for example etching at a rate around half that of the BARC 225. In an advantageous embodiment, the material of the DARC 220 is able to improve adhesion of the BARC 225, which may otherwise not adhere well to the CHM 215. In one embodiment, the DARC 220 is of a material such as, but not limited to, silicon oxide, silicon nitride, silicon oxy-nitride (SiON) or silicon carbon nitride. The DARC 220 may be sufficiently thick to inhibit the formation of pinholes that may undesirably expose the CHM 215 to an etch process used to form a template mask, form a spacer mask or used to remove a template mask, as described elsewhere herein. In one embodiment, the thickness of the DARC 220 is in the range of 150-600 angstroms.

The CHM 215 may be of any material around which a spacer mask may be formed (e.g., able to withstand an etch process used to form a spacer and able to be removed selectively to the spacer to leave a spacer mask). For example, in accordance with an embodiment of the present invention, the CHM 215 is a carbonaceous layer. As used herein, a carbonaceous layer includes inorganic layers comprising at least 20 wt % carbon. Included in this class of materials is amorphous carbon, typically comprising greater than 50 wt % carbon, and low-k dielectrics comprising at least 20 wt % carbon content. Excluded from the "carbonaceous" class are organic materials having a total carbon content less than 20 wt %, such as those commonly employed as bottom anti-reflective coating (BARC) layers. An exemplary amorphous carbon material is commercially available from Applied Materials, Inc., CA, U.S.A. under the trade name Advanced Patterning Film™ (APF). In another embodiment at the lower end of the carbon wt % range, the carbonaceous layer is a low-k dielectric, such as that commercially available from Applied Materials, Inc., under the trade name of Black Diamond™. Another embodiment employs a carbon-based spin-on hard mask (SOH).

The substrate 210 may include any thin film layer desirable for device fabrication requiring a self-aligned dual patterning integration scheme (e.g. semiconductor device structures, MEMS structures and metal line structures) over a support material which can withstand a manufacturing process. The support material may be composed of a glass or plastic sheet, a group III-V material or IV-based material such as, but not limited to, crystalline silicon, germanium or silicon/germanium.

Returning to FIG. 1, in accordance with an embodiment of the present invention, at operation 105, the pattern of the photo resist is etched into the hard mask to transfer both a wide feature and a narrow feature into the hard mask. In the exemplary embodiment depicted in FIG. 2B, both the wide resist feature 235 and the narrow resist feature 240 is transferred into both the BARC 225 and the DARC 220 to begin forming a template mask. Exemplary plasma etch chambers which may be used to transfer the pattern into the BARC 225 and the DARC 220 include the DPS AdvantEdge, E-MAX® or Enabler™, all manufactured by Applied Materials of CA, USA. It is to be understood however, that other plasma etch chambers can also be used for practicing embodiments of the present invention.

Figure 2B:
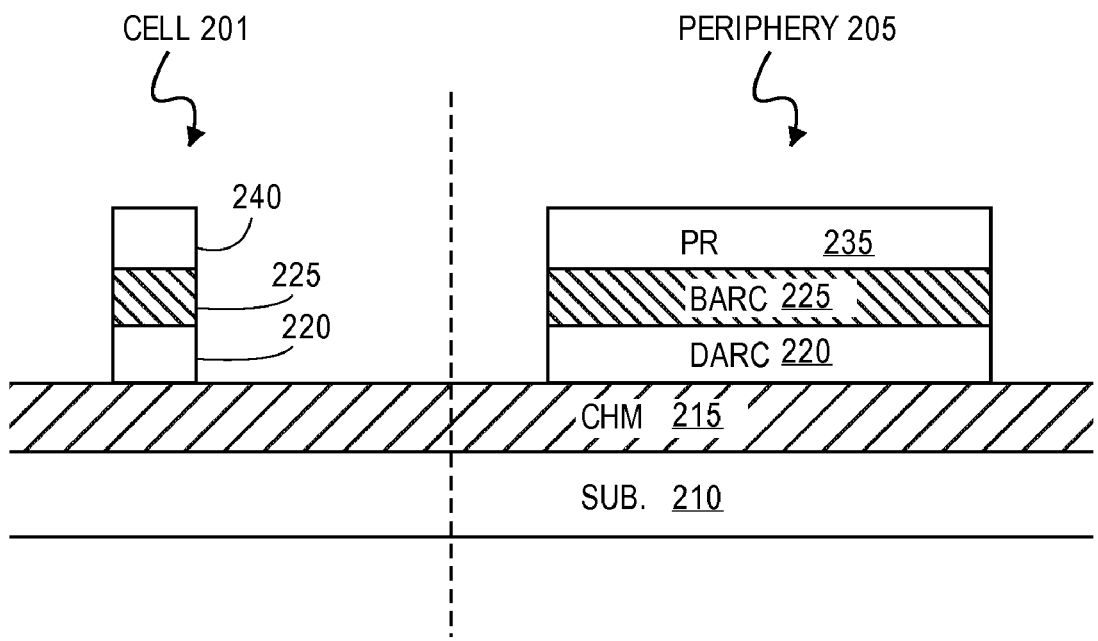

In one such embodiment, etching of the template mask includes a first trimming of at least one of the photo resist, BARC 225 or DARC 220. Generally, trimming refers to an etch which narrows the lateral CD. In a first embodiment, the photo resist is trimmed prior to etching the DARC 220. In another embodiment, a trim of the BARC 225 is performed during a BARC layer over etch to narrow the CD of the narrow resist feature 240 as it is transferred to the hard mask, clean up residue of the photoresist and/or smooth the sidewall of the BARC 225. Etching of the BARC 225 may be performed by any etch process known in the art as dependent upon the composition, thickness and CD desired. In particular embodiments, a plasma etch comprising one or more of $CF_4$, $CL_2$, HBr and $O_2$ may be utilized. Likewise, etch of the DARC 220 may be performed by any etch process suitable to provide approximately vertical sidewalls, as depicted in FIG. 2B. As an example, where DARC 220 is a SiON thin film layer, a plasma etch process including at least one of $CF_4$, $CHF_3$ and $O_2$ may be utilized.

Figure 2C:
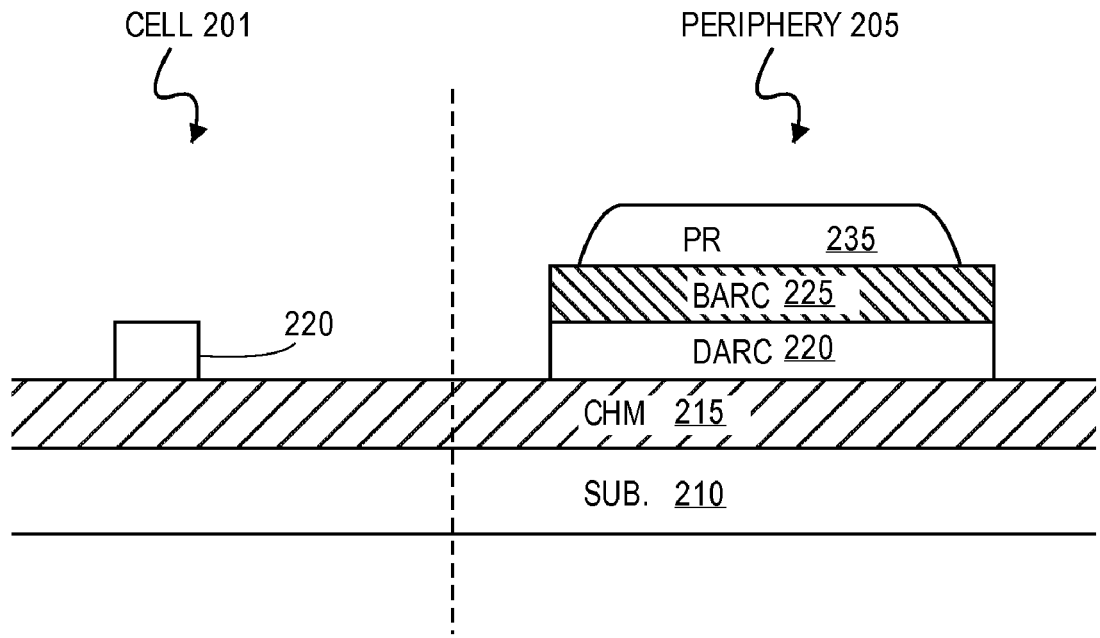
Figure 2D:
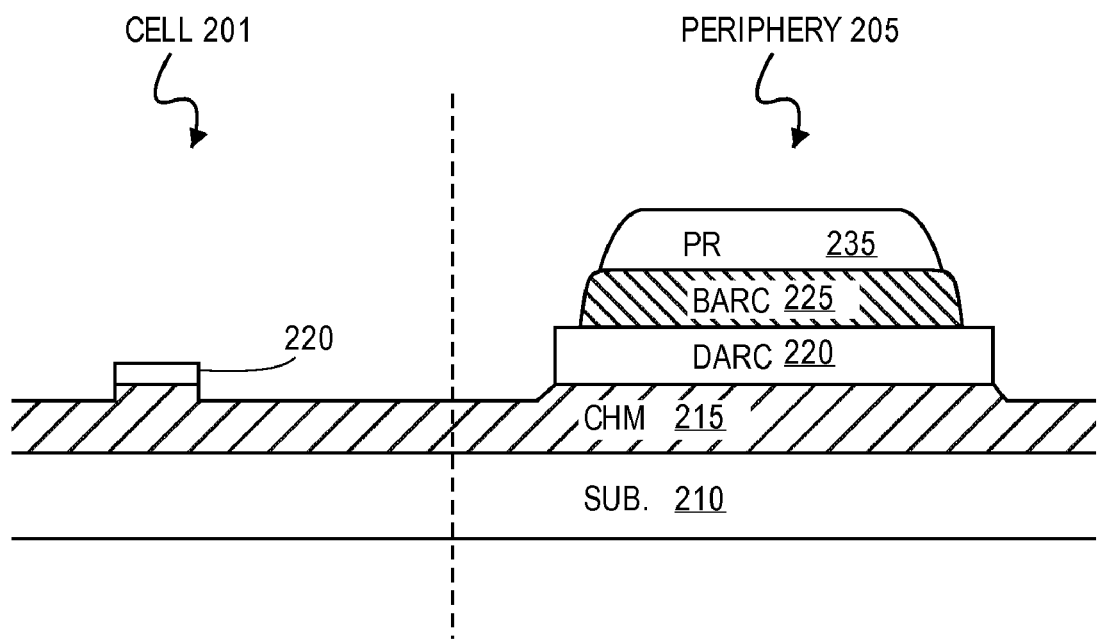

With the template mask partially formed in both the cell region 201 and periphery region 205, the selective SADP process 100 proceeds to operation 110 where the narrow resist feature 240 is removed selectively to the wide resist feature 235. As depicted in FIG. 2C a treatment may be employed to remove the photo resist from the narrow feature while retaining the wide resist feature 240 at a sufficient thickness. In one embodiment, a photo resist trimming process is applied subsequent to an etching of the DARC 220 to trim off essentially all of the narrow resist feature 240 from over the narrow template mask feature formed in the DARC 220. Depending on the embodiment, anywhere between approximately 0.5 times and 10 times the CD of the narrow resist feature 240 may be removed during this trimming process, depending on the thickness margin of the wide resist feature 235 and the difference in CD between the narrow resist feature 240 and wide resist feature 235 (with a greater trimming margin afforded both by larger CD disparity and thicker photo resist). As depicted, because the wide resist feature 235 is significantly larger than the narrow resist feature 240, the treatment removing the narrow resist feature 240 only shrinks the printed CD by a relatively small percent.

Generally, any photo resist trimming process may be applied at operation 110 with a particular embodiment employing an oxygen-based plasma etch. It should be noted however, that an arbitrary hard mask layer may alternately be used in place of the wide and narrow resist features 235 and 240, in which case operation 110 would employ a corresponding etch process capable of removing the hard mask over a narrow feature in an analogous trimming process.

Returning to FIG. 1, with the narrow resist feature 240 removed, the selective SADP process 100 proceeds to operation 115. At operation 115, the template mask is thinned in the cell region while the retained photo resist protects the as-deposited, or nominal, template mask thickness in the periphery. As further depicted in FIG. 2C, where the narrow resist feature 240 was removed, the DARC 220 is exposed to a second etch process.

Generally, the first and second etch of the template mask (i.e., before and after removal of the narrow resist feature 240) is to clear the template mask and expose an underlying material layer. In an exemplary embodiment, the DARC layer 220 is substantially cleared, or etched through, during the first template mask etch depicted in FIG. 2B and the second template mask etch depicted in FIG. 2D etches the small amount of additional DARC 220 exposed by the removal of the narrow resist feature 240. In alternate embodiments however, the template mask layer may only be partially etched (i.e., not cleared) during a first template etch operation, the narrow resist feature 240 removed, and then the remaining thickness of the DARC 220 is cleared to expose the underlying layer while also thinning the layer that was protected by the narrow resist feature 240 during the first template etch. Such an embodiment may offer improved process control because the area of exposed DARC 220 remains relatively constant through the majority of both the first and second template mask etches.

The template mask thinning operation 115 may use any etch process known in the art for the particular template mask material chosen. In one embodiment, the second etch of the template mask is performed with the same etch process used to etch the template mask prior to removing the narrow resist feature 240. In the exemplary embodiment, DARC 220 is etched a second time using any of the processes describe in reference to operation 105 and FIG. 2B.

The template mask thinning operation 115 may provide a template mask thickness delta of any amount required to ensure the template mask can be subsequently removed from a first portion of the substrate (e.g., cell region 201) without removing the thicker template mask from a second portion of the substrate (e.g., periphery region 205). In a further embodiment, the thickness of the thinned template mask should be sufficient, when added to any amount of etch into the underlying layer, to properly form a subsequent sidewall spacer adjacent to the sidewall of the thinned template mask. In the particular embodiment depicted in FIG. 2D for example, the first and/or second etch of the DARC 220 etches partially into the CHM 215 such that a sidewall step is produced which is greater than the thinned thickness of the DARC 220 in the cell region 201. As further depicted, the thinned DARC 220 of the narrow feature in the cell region 201 is approximately one half (Y) the nominal thickness (2Y) of the DARC 220 in the wide feature of the periphery region 205. In the particular embodiment where the as-deposited DARC 220 thickness is approximately 400 angstroms, the DARC 200 of the narrow feature is thinned to have a thickness delta of approximately 200 angstroms between the narrow and wide features. In other embodiments, the thickness delta may be anywhere between 25% and 75% of the nominal template mask thickness.

Figure 2E:
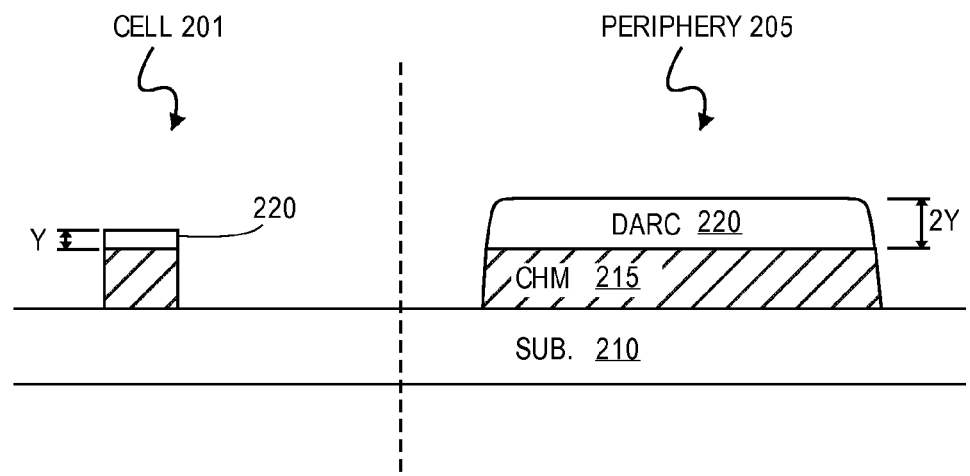

In an embodiment, at operation 120, any remaining portion of the template mask is etched in the cell and periphery and any photo resist remaining in the periphery is removed after thinning the template mask. For example, as depicted in FIG. 2E, the CHM 215 is etch through and wide resist feature 235 is removed in the cell region 201. Removal of the periphery photo resist is of course not necessary where a hard mask has been used in place of the photo resist mask, where etch of the remaining layer(s) of the template mask consumes the photo resist mask, or where a spacer mask can be subsequently formed over the photo resist and/or hard mask.

At operation 125 of FIG. 1, a spacer mask is formed around the template mask. For example, FIG. 2E depicts an exemplary embodiment where a sidewall spacer mask 250 is formed by first conformally depositing a spacer layer. The spacer layer may be of any material suitable to form a reliable mask for use in a subsequent etch process. In accordance with an embodiment of the present invention, the spacer layer is of a material such as, but not limited to, silicon nitride, silicon dioxide, silicon oxynitride, silicon carbon nitride, amorphous silicon or poly-crystalline silicon. In one embodiment where the template mask is DARC 220, the spacer layer is silicon dioxide. The spacer layer may be deposited by any process suitable to provide a conformal layer adjacent the sidewalls of the template mask, such as, but not limited to, molecular-organic CVD, low-pressure CVD or plasma-enhanced CVD. The thickness of the spacer layer may be selected to determine the width of the features in a subsequently formed spacer mask. Thus, in accordance with an embodiment of the present invention, the thickness of the spacer layer is approximately equal to the width of the template mask of the narrow features in the cell region 201.

Figure 2F:
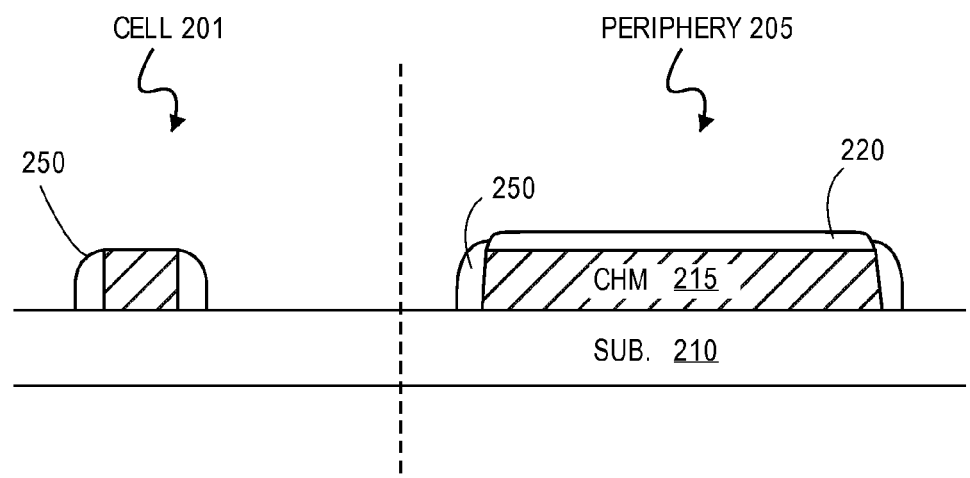

As further depicted in FIG. 2E, the spacer layer is etched to form the sidewall spacer mask 250. In accordance with an embodiment, the spacer layer is etched to expose, but not etch through the DARC 220 in the wide feature of the periphery region 205. In one embodiment, the lines of the sidewall spacer mask 250 are conformal with the sidewalls of the template mask. Thus, there are two lines for the spacer mask for every narrow feature in the cell region 201, as depicted in FIG. 2F. Sidewall spacers may of course also be formed adjacent to the sidewalls of the wide feature in the periphery region 205.

The spacer layer may be etched to provide the sidewall spacer mask 250 by any process known capable of providing well-controlled dimensions. For example, in one embodiment, the spacer layer is composed of silicon dioxide, the spacer layer is etched to form the sidewall spacer mask 250 using a dry etch process with a gas such as, but not limited to, $C_4F_8$, $CH_2F_2$ or $CHF_3$.

Returning to FIG. 1, at operation 130, the thinned template mask is removed from the cell region without removing the thick template mask in the periphery. In one embodiment, the thinned template mask is removed during the spacer etch or spacer over etch. In accordance with an embodiment of the present invention, as depicted in FIG. 2F, the spacer etch is not of a sufficient duration to clear the nominally thick DARC 220 in the periphery region 205. Therefore, the periphery region 205 has a mask over the CHM 215; the mask therefore including both the DARC 220 and the sidewall spacer mask 250 while the cell region 201 has only the spacer mask 250 and the CHM 215 is exposed. As such, the amount by which the CD of the wide resist feature 235 is reduced by the removal of the narrow resist feature 240 (e.g., as depicted in FIG. 2C) may be offset by the sidewall spacer formed adjacent to the retained template mask (e.g., as depicted in FIG. 2F). As further depicted in FIG. 2F, removal of the thinned template mask entails etching the exposed CHM 215 to leave only the sidewall spacer mask 250. For example, where the CHM 215 is amorphous carbon, a dry etch process using a plasma composed of gases such as, but not limited to, the combination of $O_2$ and $N_2$ or the combination of $CH_4$, $N_2$ and $O_2$, may be employed to remove the exposed CHM 215.

Figure 2G:
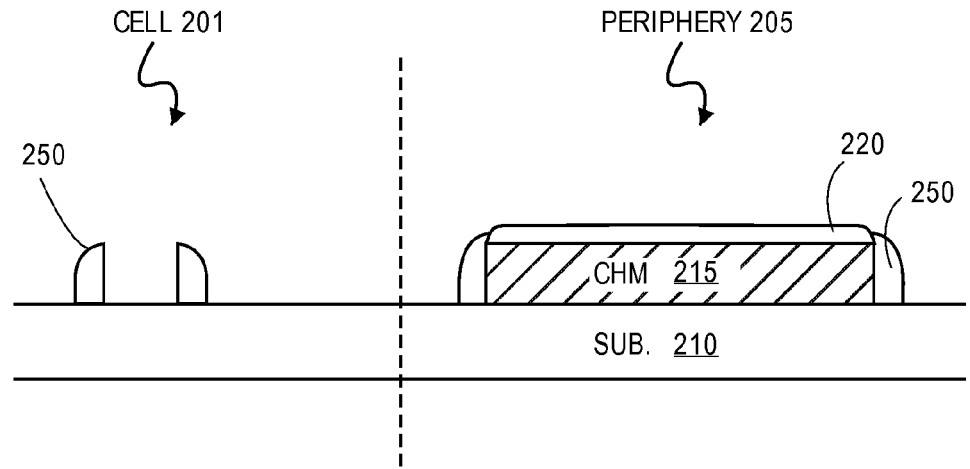
Figure 3:
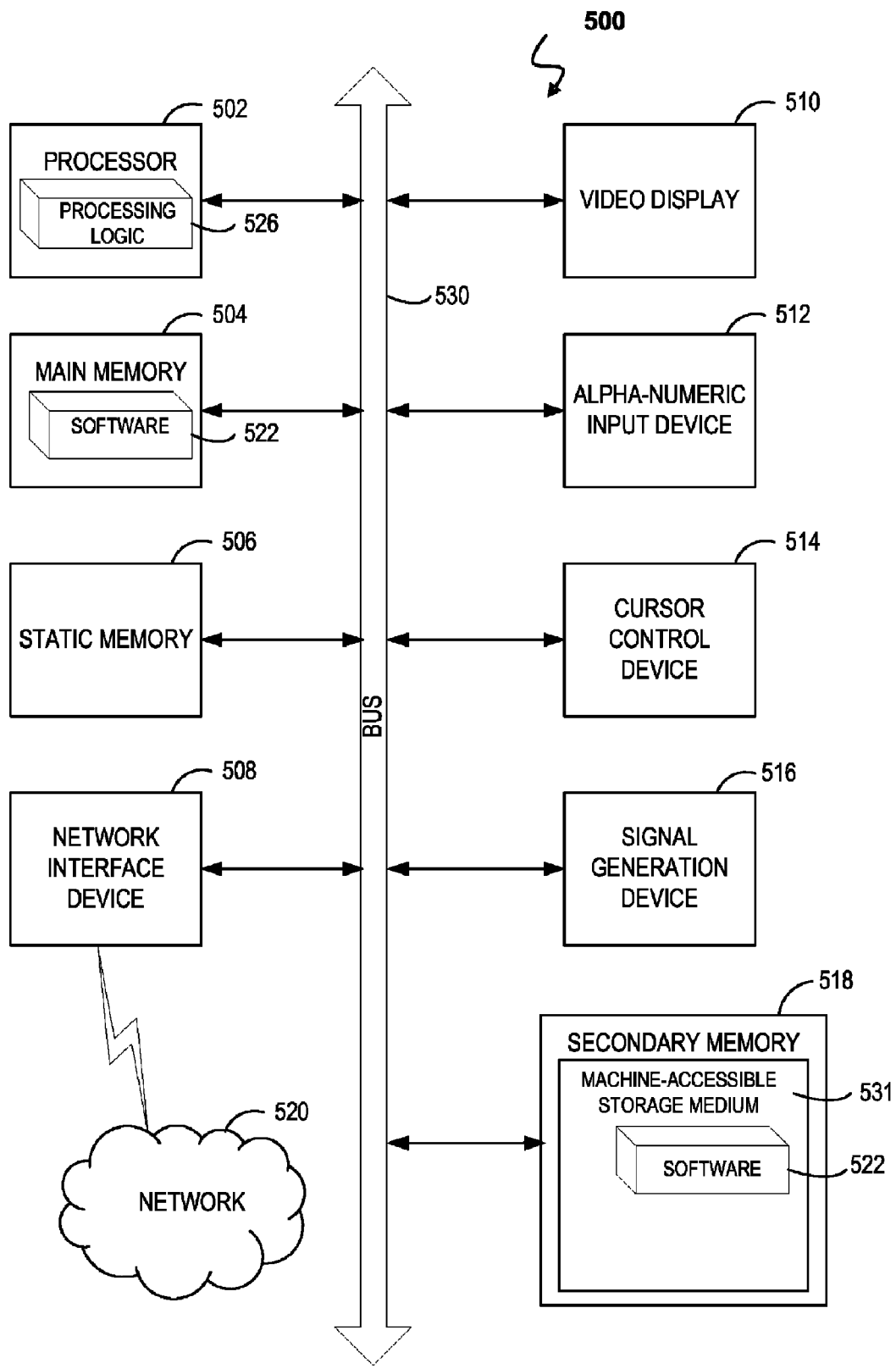
FIG. 3 illustrates a block diagram of a computer system, in accordance with an embodiment of the present invention.

The selective SADP process 100 then completes at operation 135 with etching of an underlying layer using the spacer mask in one region of the substrate and template mask in another region of the substrate. For example, as depicted in FIG. 2G, with the CHM 215 etched, the substrate 210 is masked by the spacer mask 250 in the cell region 201 while the CHM 215 is unetched and masked by the DARC 220 in the periphery region 205. Etching of substrate 210 may be performed by any manner known in the art, depending on the films included in the substrate 210. As such, a single photolithographic masking process generates the desired pitch-reduced and/or CD-reduced pattern in the cell region 201 and a non-pitch-reduced non-CD-reduced pattern in the periphery region 205. This pattern may then be used as an etch mask of a device layer, for example, in a cell of a memory device and in a periphery of a memory device FIG. 3 illustrates a diagrammatic representation of a machine in the exemplary form of a computer system 500 which may be utilized to control one or more of the operations, process chambers or processing platforms described herein. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the process operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the methods or functions described herein. The software 522 may also reside, completely or at least partially, within the main memory 504 and/or within the processor 502 during execution thereof by the computer system 500, the main memory 504 and the processor 502 also constituting computer-readable storage media. The software 522 may further be transmitted or received over a network 520 via the network interface device 508.

The computer-readable storage medium 531 may further be used to store a set of instructions for execution by a processing system and that cause the system to perform any one or more of the embodiments of the present invention. Embodiments of the present invention may further be provided as a computer program product, or software, that may include a computer-readable storage medium having stored thereon instructions, which may be used to program a computer system (or other electronic devices) to perform a process according to the present invention. A computer-readable storage medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, and flash memory devices, etc.).

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method of patterning a thin film, comprising:
    performing a first etch of a first film layer disposed below a patterned mask to form both a narrow feature and a wide feature in the first film layer;
    trimming lateral dimensions of the patterned mask after performing the first etch, the trimming by an amount sufficient to completely remove the patterned mask from a top surface of the narrow feature without completely removing the patterned mask from a top surface of the wide feature; and
    performing a second etch of the first film layer to thin the exposed narrow feature relative to the wide feature formed in the first film layer.

2. The method as in claim 1, wherein forming the sidewall spacer further comprises:
    conformally depositing a spacer layer over the thinned narrow feature; and
    anisotropically etching the spacer layer, wherein the spacer layer is etched with an over etch amount insufficient to etch through the wide feature formed in the first film layer.

3. The method as in claim 1, wherein the first etch comprises etching through the first film layer to expose an underlying layer of a material distinct from the first film layer and wherein the second etch comprises etching the first film, with substantially the same etch process employed for the first etch, for a predetermined duration.

4. The method as in claim 1, wherein the first etch comprises etching partially through the first film layer and wherein the second etch comprises etching the first film, with substantially the same etch process employed for the first etch, to clear the first film in all regions except for the exposed narrow feature and the masked wide feature.

5. The method as in claim 1, further comprising:
    forming a sidewall spacer adjacent to a first and second sidewall of the narrow feature;
    etching through the thinned first film layer to remove the narrow feature while retaining the sidewall spacer and the wide feature in the first film layer;
    etching a second film layer masked by the spacer and the first film-layer, wherein the spacer mask forms two feature in a first area of the second film spaced apart by a distance based on the narrow feature and wherein the first film-layer forms a single feature having a width based on the wide feature.

6. The method as in claim 5, wherein the first film layer comprises silicon-oxy-nitride (SiON) and the first etch comprises plasma etch including at least one of: $CF_4$, $CHF_3$ and $O_2$.

7. The method as in claim 5,
    wherein the two features are a cell region of a memory circuit and wherein the single feature is in a periphery region of the memory circuit.

8. The method as in claim 1, wherein the amount is between approximately 0.5 and 1.5 times the critical dimension of the narrow feature.

9. The method as in claim 8, wherein the critical dimension of the wide feature is between 5 and 10 times greater than the critical dimension of the narrow feature.

10. The method as in claim 8, wherein the patterned mask comprises a photo resist and trimming the dimensions of the patterned mask comprises etching the photo resist with an oxygen containing plasma etch process.

11. A method of patterning a thin film, comprising:
    depositing a template hard mask over a cell region and a periphery region of an integrated memory chip;
    lithographically patterning a narrow feature and a wide feature in a photo resist layer disposed over the template hard mask;
    performing a first etch of the template hard mask to transfer both the narrow feature and the wide feature into at least a portion of template hard mask;
    removing the photo resist layer from over the narrow feature, exposing the template hard mask, without completely removing the photo resist layer disposed over the wide feature;
    performing a second etch of the template hard mask to thin the exposed narrow feature relative to the wide feature masked by the photo resist layer;
    forming a sidewall spacer adjacent to a first and second sidewall of the narrow feature;
    etching through the thinned narrow feature while retaining the wide feature in the template hard mask;
    etching a second film layer masked by the spacer and the template hard mask, wherein the spacer mask forms two features spaced apart by a distance based on the narrow feature in a first area of the second film and wherein the template hard mask forms a single feature based on the wide feature in a second area of the second film; and
    etching the cell region of a memory circuit masked by the two feature while etching the periphery region of the memory circuit masked by the single feature.

12. The method as in claim 11, further comprising depositing a bottom anti-reflective coating (BARC) over the template hard mask, the BARC deposited to a thickness of between 300 and 400 angstroms.

13. The method as in claim 11, wherein the template hard mask comprises a silicon oxy-nitride (SiON) deposited to a thickness of between 300 and 600 angstroms disposed over a carbon-based material deposited to a thickness of between 600 and 1500 angstroms.

14. The method as in claim 13, wherein the performing the first etch comprises etching through the SiON to expose the carbon-based material not protected by the photo resist layer and wherein the second etch comprises etching the SiON exposed upon removing the photo resist layer from the narrow feature, with substantially the same etch process employed for the first etch, for a predetermined duration.

15. The method as in claim 11, wherein removing the photo resist layer from. over the narrow feature while substantially retaining the overlying mask disposed over the wide feature further comprises trimming the dimensions of the photo resist layer by an amount between approximately 0.5 and 1.5 times the critical dimension of the narrow feature.

16. The method as in claim 15, wherein the critical dimension of the wide feature is between 5 and 10 times greater than the critical dimension of the narrow feature.

17. A method of patterning a thin film, comprising:
performing a first etch of a first film layer disposed below a patterned mask to form both a narrow feature and a wide feature in the first film layer;
removing the patterned mask to expose the narrow feature without completely removing the patterned mask on the wide feature;
performing a second etch of the first film layer to thin the exposed narrow feature relative to the wide feature formed in the first film layer;
forming a sidewall spacer adjacent to a first and second sidewall of the narrow feature;
etching through the thinned first film layer to remove the narrow feature while retaining the sidewall spacer and the wide feature;
etching a second film layer masked by the sidewall spacer and the first film-layer to form two features in a first area of the second film and a single feature in a second area of the second film.

18. The method as in claim 17, further comprising:
etching a cell region of a memory circuit masked by the pitch-reduced pattern of the second film layer while etching a periphery region of the memory circuit masked by the non-pitched-reduced area of the second film layer.

19. The method as in claim 17, wherein removing the patterned mask to expose the narrow feature without completely removing the patterned mask on the wide feature further comprises trimming lateral dimensions of the patterned mask by an amount between approximately 0.5 and 1.5 times the critical dimension of the narrow feature.

* * * * *